United States Patent [19]
Eddins

[11] Patent Number: 4,464,630
[45] Date of Patent: Aug. 7, 1984

[54] TRANSIMPEDANCE PRE-AMPLIFIER
[75] Inventor: W. T. Eddins, West Melbourne, Fla.
[73] Assignee: Harris Corporation, Melbourne, Fla.
[21] Appl. No.: 128,146
[22] Filed: Mar. 7, 1980
[51] Int. Cl.³ ............................................. H03F 1/36
[52] U.S. Cl. ................................ 330/107; 330/207 P; 330/307
[58] Field of Search ............... 330/306, 307, 308, 107, 330/59, 294, 207 P

[56] References Cited
U.S. PATENT DOCUMENTS
3,787,776  1/1974  Cath ................................ 330/207 P
4,027,271  5/1977  Cave .................................... 330/307

OTHER PUBLICATIONS
R. A. Penfold, "Simple Quadraphonic Amplifier", Radio and Electronics Constructor, vol. 30, No. 12, Jul. 1977, pp. 753–760.

Primary Examiner—Michael J. Tokar
Attorney, Agent, or Firm—Antonelli, Terry & Wands

[57] ABSTRACT

A transimpedance pre-amplifier is used in connection with optical detectors and is designed to obtain low noise, low distortion and flat frequency response simultaneously. The amplifier design accomplishes low distortion and flat frequency response over a wide range of input signals by designing the pre-amplifier circuitry in such a manner as to compensate for the phase shift introduced by a feedback network connected across the input and output of the amplifier. This adjustment allows the feedback network to be of such a value as to effectively control any thermal noise introduced by the feedback resistor-input capacitance system. This compensation for the phase shift allows the phase margin and therefore stability to be controlled by means of the load impedance on the output transistor of the amplifier circuit. The result of such new relationship is that the amplifier may be designed based upon the desired location of the pole by adjusting the feedback resistance in such a manner as to negate the effects of the thermal feedback and from such calculation the load impedance connected across the output of the transistors which comprise the amplifier section are then determined by the equations derived.

6 Claims, 4 Drawing Figures

4,464,630

TRANSIMPEDANCE PRE-AMPLIFIER

FIELD OF THE INVENTION

This invention relates to pre-amplifiers for use with a single fiber communication link.

BACKGROUND OF THE INVENTION

The first order parameters which normally limit the maximum length of the communication link are
(1) magnitude of coupled power,
(2) fiber losses, and
(3) receiver sensitivity.

In general, the only control a designer has over the first two parameters is by component and fiber selection. In the case of receiver design, however, circuit design expertise can yield up to 10 dB (optical) improvement over conventional approaches which can add several kilometers to the maximum distance achievable without repeaters. With this in mind, one of the areas of improvement which can be made concerns the use of the pre-amplifier section.

In co-pending application Ser. No. 149,291, filed by Paul W. Casper et al on May 12, 1980 entitled "multi-Channel, Repeatered, Fiber Optic Communication Network" and assigned to the assignee of the present application, there is described a system in which optical signals are transmitted over the fiber optic communication links and received by an optical receiver module. In the receiver module the incoming signals are converted by means of an avalanche photo diode and are made ready for further processing through the use of a pre-amplifier. Advantageously, the system described in the above-referenced application employs a transimpedance pre-amplifier according to the present invention. Although the transimpedance amplifier of the present invention applies specifically to the above-identified co-pending application, it also applies to any high data rate optical signal system such as the T4 system.

The problem of obtaining low distortion and flat frequency response over a wide range of input signals is solved in the prior art by the use of negative feedback. When the input signal is a current as in the case for avalanche photo diodes and other diode optical detectors, a "transimpedance amplifier" (an operational amplifier with a single resistor for the feedback network) is an obvious choice. However, in the conventional implementation, the feedback resistor-input capacitance-system bandwidth product must be kept small because of the additional phase shift caused by the feedback resistance and input capacitance. This results in the amplifier being dominated by the thermal noise of the feedback resistor. Therefore, one of the prior art problems which must be solved is the implementation of a feedback system of a transimpedance amplifier which can produce low noise, low distortion and flat frequency response in the presence of a large value of feedback resistor-input capacitance-system bandwidth product.

SUMMARY OF THE INVENTION

The present invention relates to an improved amplifier circuit which has a feedback resistance connected between the output and input of the amplifier circuit. The improvement relates to the phase margin compensation circuit which is connected across the output of the amplifier which maintains a flat frequency response over a wide range of input signals and at the same time maintains a low noise distortion by keeping the phase margin of the amplifier constant when the feedback resistance is varied.

In a preferred embodiment, the value of the feedback resistance-input capacitance bandwidth product is inversely proportional to the impedance value of the phase margin compensation circuit. Also in the preferred embodiment, the amplifier circuit contains a plurality of transistors which are connected to form a transimpedance amplifier. The transistors which formed the transimpedance amplifier are supported by amplifier bandpass determining circuits which include the above-mentioned phase margin compensation circuit. This phase margin compensation circuit located within the amplifier bandpass determining circuit offsets the phase margin contribution of the feedback resistor and input capacitance product.

The amplifier design of the present invention improves the sensitivity in bandwidth of previous designs while also improving the dynamic range at lower distortion. Additionally, the low frequency response may be moved easily to the 10 Hz range by practical-value component selection and the previous difficulties of matching pole-zero locations for wide band equalization are eliminated. The pre-amplifier design is also such that the frequency response may be tailored so as to perform active filtering with a three-pole response characteristic thereby eliminating the need for external discrete filters to establish receiver noise bandwidth.

DETAILED DESCRIPTION OF THE PREFERRED EMBODIMENT

Figure 1:
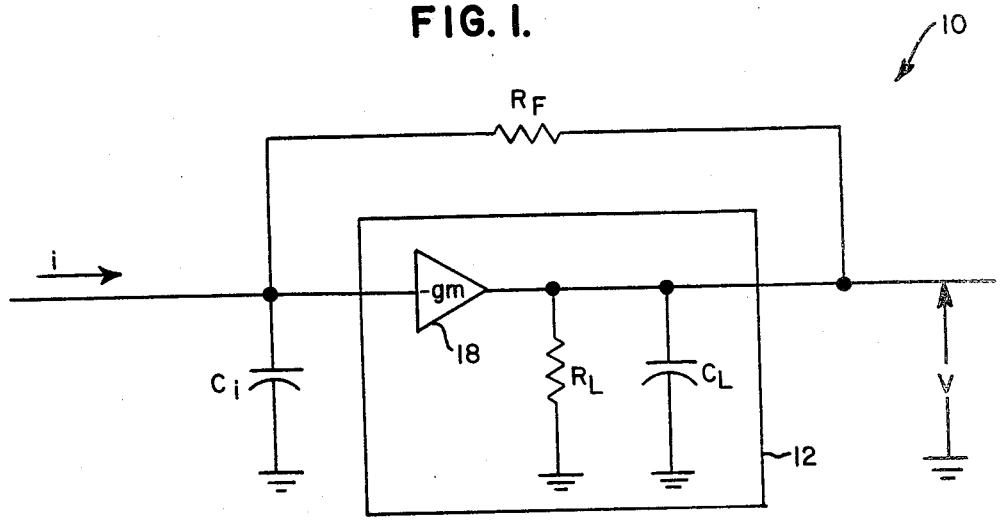
FIG. 1 is a schematic representation illustrating the basic concept of the present invention.

The pre-amplifier shown at 10 in the FIG. 1 has an operational amplifier 12 with a feedback resistance $R_f$ connected between the output and the input of the amplifier 12 as well as an input capacitance $C_i$. The amplifier 12 is shown comprising a gain section 18 and a load resistance $R_L$ and $C_L$, both of which are attached to the output of the gain section 18 and grounded.

The problem of obtaining low distortion and flat frequency response over a wide range of input signals is solved by the use of the negative feedback $R_f$ which is particularly useful in the case for optical detectors because the input signal is a current and the use of the negative feedback resistor produces a transimpedance amplifier thereby providing a voltage output from the amplifier. Conventionally the feedback resistor-input capacitance system bandwidth product was kept small in order to accomplish the low distortion and flat frequency response over the wide range of input signals. One of the drawbacks with this particular small bandwidth product was that the thermal noise of the feedback resistor dominated the amplifier. The following analysis makes clear that the system of FIG. 1 may be designed so that proper operation is obtained in the presence of a large value of feedback resistor-input capacitance-system bandwidth product which allows for low noise, low distortion and flat frequency response.

The open loop gain of the operational amplifier 12 of FIG. 1 is given by:

$$A(w) = -gmR_L(1+jwR_LC_L)^{-1} \tag{1}$$

The phase shift through the amplifier is therefore:

$$\Phi_1 = wt_d + \arctan wK_LC_L \tag{2}$$

where $t_d$ is the delay time for transmission of the signal through gain section 18. The effect of the additional feedback connection of resistor $R_f$ and the input capacity $C_i$ produces an additional phase shift:

$$d_2 = \arctan wR_fC_i \tag{3}$$

Let $w = w_1$ when the loop gain is unity. Then the phase margin will be:

$$\Phi_m = 180° - (w_1t_d + \arctan w_1R_LC_L + \arctan w_1R_fC_i) \tag{4}$$

In a conventional operational amplifier $R_3$ is made very large so that the arc tan $w_1R_LC_L$ is close to 90°. If the phase margin is to be 45° or more in the feedback resistor connection of FIG. 1 in order to obtain a stable amplifier, then as can be seen from equation (4), $w_1R_fC_i$ must be less than unity. Since the closed loop frequency response $w_0$ is approximately equal to the unity gain open loop response $w_1$, then $W_0R_fC_i$ must also be kept less than unity, which will result in the amplifier being dominated by thermal noise from $R_f$. Therefore, it can be seen from equation (4) that the $R_LC_L$ and $R_fC_i$ are interchangeable with regard to the phase margin. That is if $w_1R_LC_L$ is made small, then $w_1R_fC_i$ can be made large without affecting the phase margin. The design of the detailed schematic of FIG. 3 is based upon this principle which produces a transimpedance amplifier possessing the desired characteristics of low noise, low distortion, and flat frequency response simultaneously.

Figure 3:
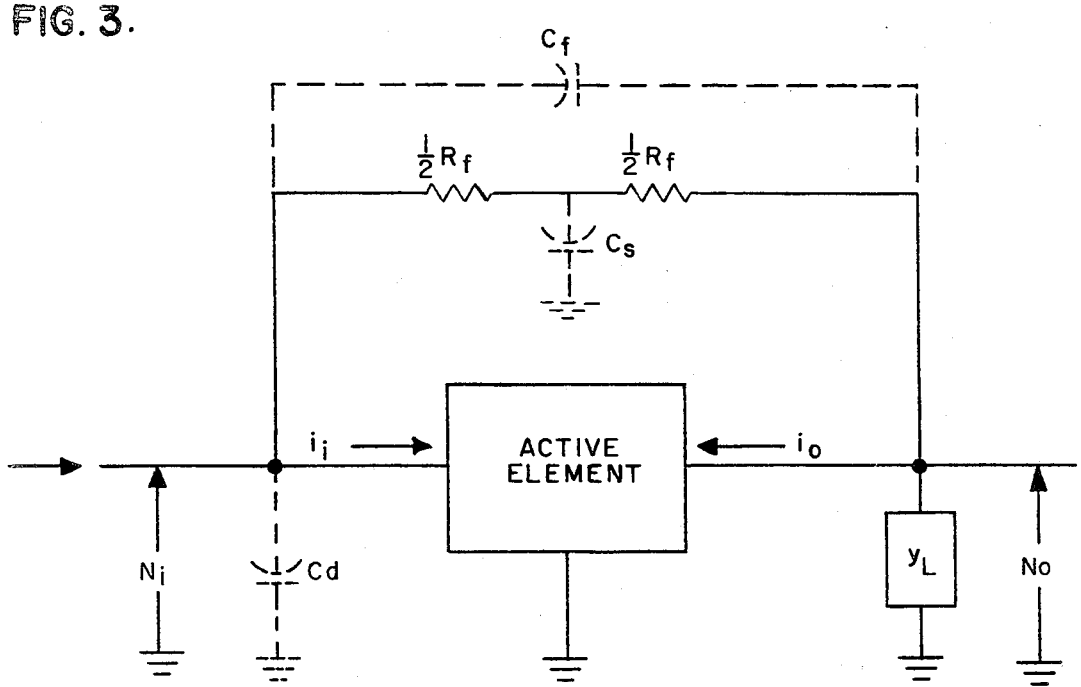
FIG. 3 is a model representation of the transimpedance amplifier of FIG. 2 for purposes of bandpass analysis.

FIG. 3 illustrates the detailed schematic of the transimpedance amplifier of FIG. 1 including the input optical detector shown at 20. The operational amplifier portion of FIG. 3 consists of transistors $Q_1$ and $Q_2$ as well as resistors $R_1$ through $R_5$ and $C_1$, $C_2$, and $C_3$ while the feedback resistor $R_f$ remains as from FIG. 1.

The transistor $Q_1$ functions to provide the current gain while the transistor $Q_2$ provides the voltage gain. The resistor $R_3$ connected to the emitter of $Q_1$ establishes the collector current bias level for $Q_1$, while the resistor $R_2$ connected between the voltage supply $V_5$ and the collector of $Q_2$ establishes the collector current bias level for $Q_2$. The resistor $R_1$ connected between the voltage supply $V_5$ and the collector of $Q_1$ is used to establish the collector voltage bias level for $Q_1$, while the capacitor $C_1$ connected between the collector of $Q_1$ and ground provides a signal current return path for $Q_1$. Resistors $R_4$ connected to the base of $Q_2$ and $R_5$ connected to the output of the amplifier as well as capacitors $C_2$ connected to the base of the transistor $Q_2$ and the capacitor $C_3$ connected to the output of the amplifier are used to adjust the open loop gain and frequency response of the system.

The selection of transistor types and collector current bias levels for the configuration of FIG. 3 is based upon the required frequency response for the pre-amplifier as well as the attainment of the maximum signal-to-noise ratio. The best transistors to be used for the pre-amplifier section are those having a high hFE and a small $R_b$ as well as small common emitter input capacity. Low noise-small signal microwave transistors are examples which meet the above requirements.

The collector current bias level of the input stage is a critical factor in achieving maximum signal-to-noise ratio. The optimum collector current for $Q_1$ is given by:

$$I_{c1} = kT(q)^{-1} \times 2\pi B_n(C_d + C_{ie})(K_1 hFE)^{-\frac{1}{2}}, \tag{5}$$

where
$B_n$ is the noise bandwidth,
$C_d$ is the detector capacity (including board capacity),
$C_{ie}$ is the common emitter input capacity for $Q_1$, and $$K_1 = \frac{\int_0^\infty F(W) \times W^2 dw}{\left(\int_0^\infty F^2(W)dw\right)^3}$$

where $F(W)$ is the function which describes the system bandpass. Several values of $K_1$ are:

$K_1 = 0.810$ for a 2-pole Butterworth characteristic,
$K_1 = 0.453$ for a 3-pole Butterworth characteristic,
$K_1 = 0.393$ for a 4-pole Butterworth characteristic,
$K_1 = 0.809$ for a 3-pole Bessel characteristic.

The collector current bias level for $Q_2$ should be high enough to obtain the necessary gain and bandwidth, but not so high that the base current of $Q_2$ is a significant fraction of the collector current of $Q_1$.

In order to complete the pre-amplifier design, it is necessary to know the required bandpass characteristics and cutoff frequency. The choice of values for $R_4$, $R_5$, $C_2$, $C_3$ and $R_f$, along with the collector current bias level for $Q_2$, fix the bandpass characteristics and cutoff frequency.

BANDPASS COMPUTATION

In order to complete the bandpass design, it is necessary to know the frequency characteristics of all the components in the pre-amplifier, including the parasitic capacities associated with the layout. Of particular importance are the parameters used to describe the transistors. Y-parameters are convenient for this application; they may be supplied with the data sheets, or they may be calculated from h-parameters or S-parameters.

The transfer function of the preamplifier is given by:

$$Z_T = Z_f AB(1+AB)^{-1}, \tag{7}$$

where $Z_T$ is the transimpedance (the ratio of output voltage to input current), A is the gain of the operational amplifier, and B is the feedback factor (the fraction of this output voltage which is fed back to the input terminal).

In general $Z_f$, A, and B are frequency dependent, so $Z_T$ versus frequency corresponds to a plot of the frequency response of the preamplifier.

Consider the operational amplifier to consist of a 3-terminal active element driving a load admittance $Y_L$, as shown in FIG. 3. Assume that the feedback element consists of a noninductive resistor $R_f$ with parasitic capacities $C_f$ in parallel and $C_s$ to ground. Assume that parasitic capacity $C_d$ connects to the input terminal.

Figure 2:
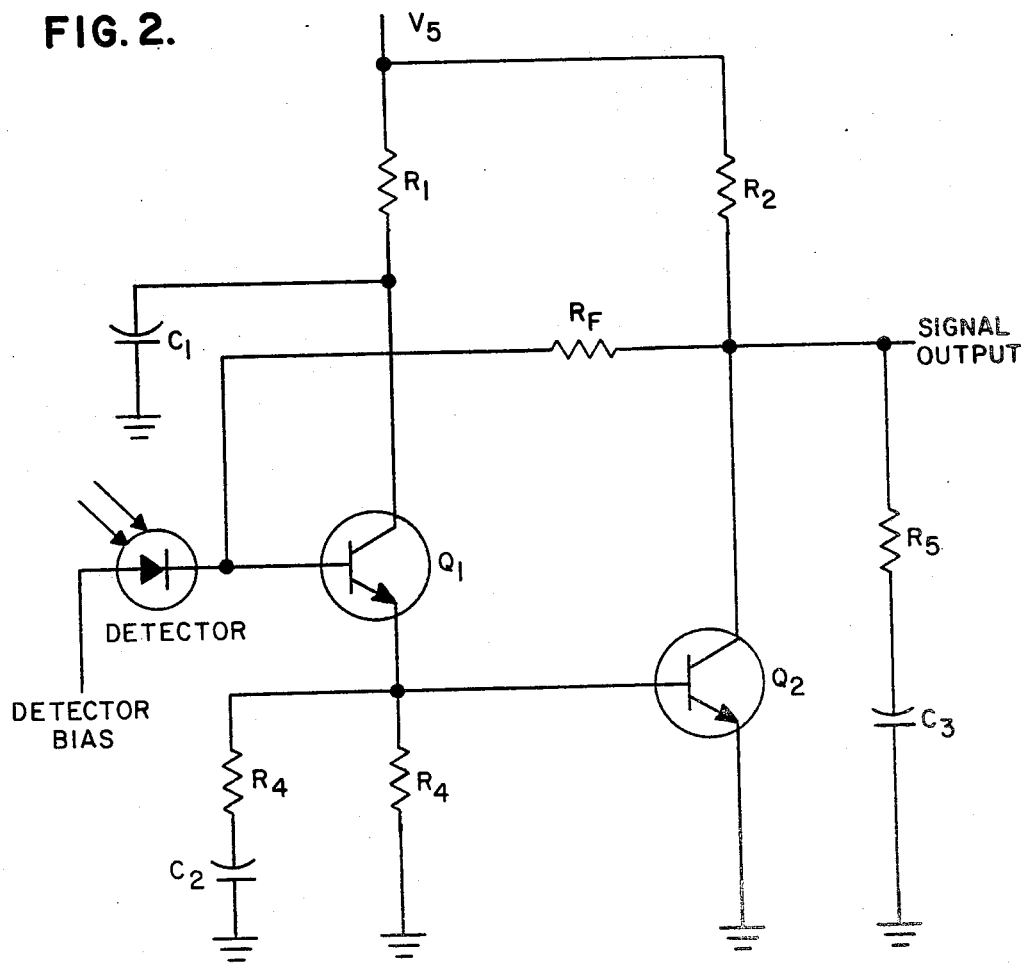
FIG. 2 is a detailed schematic of the transimpedance amplifier of the present invention.

The load admittance $y_L$ is determined by resistors $R_2$ and $R_5$ and capacitor $C_3$, (FIG. 2) along with the parasitic capacity associated with the layout and the input admittance of the circuit to which the preamplifier output is connected.

The input capacity $C_d$ is the capacity due to the detector, plus the parasitic capacity associated with the layout.

The load admittance $y_L$ is determined by resistors $R_2$ and $R_5$ and capacitor $C_3$, (FIG. 2) along with the parasitic capacity associated with the layout and the input admittance of the circuit to which the preamplifier output is connected.

The input capacity $C_d$ is the capacity due to the detector, plus the parasitic capacity associated with the layout.

Figure 4:
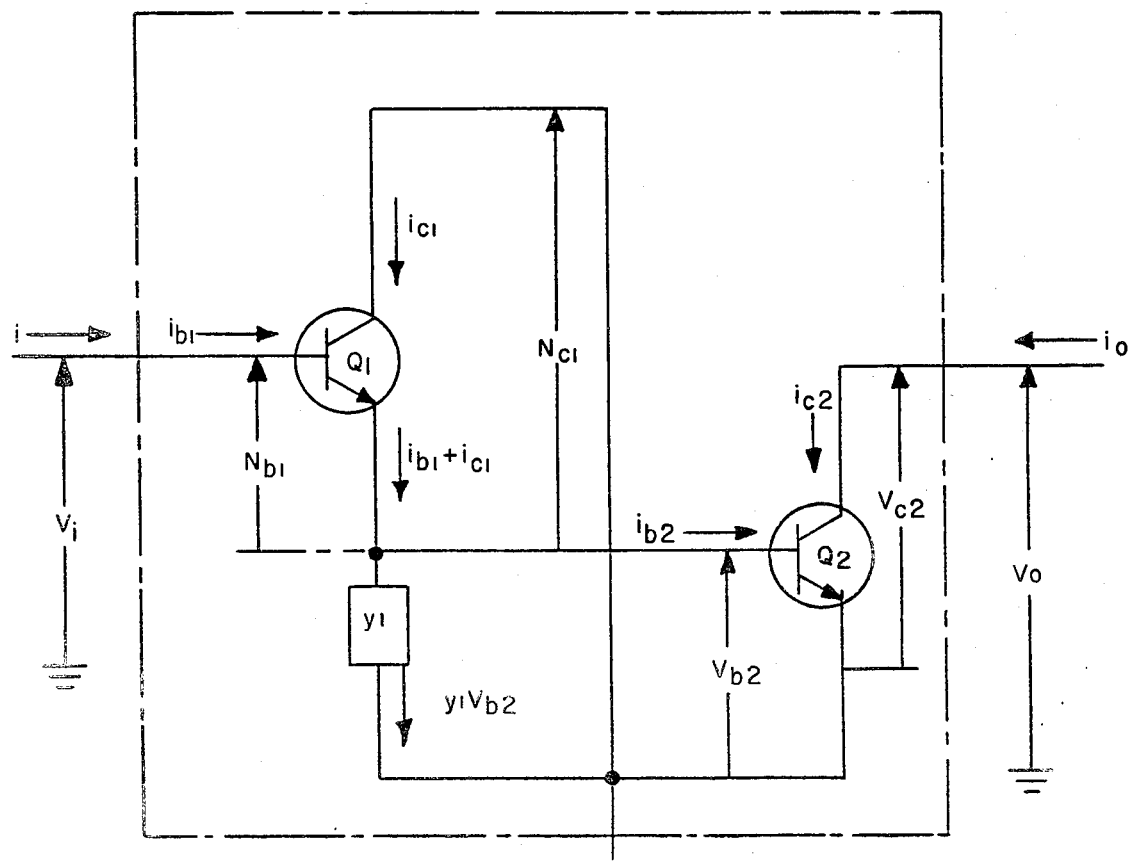
FIG. 4 is a model of the active element of FIG. 3 for purposes of Y-parameter calculation.

The active element consists of transistors $Q_1$ and $Q_2$, resistors $R_3$ and $R_4$, and capacitor $C_2$, if wet let $$y_1 = R_3^{-1} + (R_4 - j(wc_2)^{-1})^{-1}, \tag{8}$$

then the active element may be described by the circuit of FIG. 4.

Assume that the active element is described by the y-parameters $y_{11}$, $y_{12}$, $y_{21}$, and $y_{22}$ such that $$i_i = y_{11}V_i + y_{12}V_o \tag{9}$$

$$i_o = y_{21}V_i + y_{22}V_o \tag{10}$$

Let $$yi_1 = yie \text{ of } Q_1 \tag{11}$$

$$yr_1 = yre \text{ of } Q_1 \tag{12}$$

$$yf_1 = yfe \text{ of } Q_1 \tag{13}$$

$$yo_1 = yfe \text{ of } Q_1 \tag{14}$$

$$yi_2 = yfe \text{ of } Q_2 \tag{15}$$

$$yr_2 = yre \text{ of } Q_2 \tag{16}$$

$$yf_2 = yfe \text{ of } Q_2 \tag{17}$$

$$yo_2 = yoe \text{ of } Q_2 \tag{18}$$

$$y_s = yi_1 + yr_1 + yf_1 + yo_1 + yi_2 + y_1 \tag{19}$$

analyzing the circuit of FIG. 4, taking into account equations (9) through (19) give $$y_{11} = \frac{yi_1(yo_1 + yi_2 + y_1) - yr_1 yf_1}{y_s} \tag{20}$$

$$y_{12} = \frac{yr_2(yi_1 + yr_1)}{y_s} \tag{21}$$

$$y_{21} = \frac{yf_2(yi_1 + yf_1)}{y_s} \tag{22}$$

$$y_{22} = yo_2 - \frac{yr_2 yf_2}{y_s} \tag{23}$$

analyzing the circuit of FIG. 3, taking into account equations (9) and (10) gives $$Z_f = \cfrac{1}{\cfrac{1}{R_f\left(1 + jw\cfrac{R_f}{4}C_s\right)} - y_{12} + jwC_f} \tag{24}$$

$$A = \cfrac{y_{21} - \cfrac{1}{R_f\left(1 + jw\cfrac{R_f}{4}C_s\right)} - jwC_f}{y_L + y_{22} + \cfrac{\left(1 + jw\cfrac{R_f}{2}C_s\right)}{R_f\left(1 + jw\cfrac{R_f}{4}C_s\right)} + jwC_f} \tag{25}$$

$$B = \cfrac{\cfrac{1}{Z_f}}{y_{11} + \cfrac{\left(1 + jw\cfrac{R_f}{2}C_s\right)}{R_f\left(1 + jw\cfrac{R_f}{4}C_s\right)} + jw(C_f + C_d)} \tag{26}$$

If the frequency range of interest is sufficiently low, so that $wR_fC_f<<1$, $wR_fC_s<<1$, $R_fb_{12}<<1$, and $b_{21}<<g_{21}$, then equations (24), (25) and (26) reduce to $$Z_f = \frac{R_f}{1 - R_f g_{12}} \tag{27}$$

$$A = \frac{A_o}{1 + j\frac{w}{w_A}} \tag{28}$$

$$B = \frac{B_o}{1 + j\frac{w}{w_B}} \tag{29}$$

where $$A_o = \frac{g_{21} - \frac{1}{R_f}}{\frac{1}{R_L} + \frac{1}{R_f} + g_{22}} \tag{30}$$

$$w_A = \frac{\frac{1}{R_L} + \frac{1}{R_f} + g_{22}}{C_L + C_{22}} \tag{31}$$

$$B_o = \frac{1 - R_f g_{12}}{1 + R_f g_{11}} \tag{32}$$

$$w_B = \frac{1 + R_f g_{11}}{R_f(C_d + C_{11})} \tag{33}$$

substituting (28) and (29) into (7) and solving gives:

$$Z_T = \frac{w_A w_B A_o B_o}{w_A w_B (1 + A_o B_o) - w^2 + jw(w_A + w_B)} \tag{34}$$

Let $jw = S$, then \hfill (35)

$$Z_T = \frac{w_A w_B A_o B_o}{S^2 + S(w_A + w_B) + w_A w_B(1 + A_o B_o)} \tag{36}$$

$$Z_T = \frac{w_A w_B A_o B_o}{(S - S_1)(S - S_2)} \tag{37}$$

then from (36) and (37)

$$S_1 = -\frac{(w_A + w_B)}{2} - j\sqrt{w_A w_B(1 + A_o B_o) - \frac{(w_A + w_B)^2}{4}} \quad (38)$$

$$S_2 = -\frac{(w_A + w_B)}{2} + j\sqrt{w_A w_B(1 + A_o B_o) - \frac{(w_A + w_B)^2}{4}} \quad (39)$$

Equations (38) and (39) give the locations of the poles which describe the frequency response of the pre-amplifier.

In many instances the desired locations of the poles are known, and it is required to design the pre-amplifier to meet them. For this purpose, equations (36) and (37) are solved for $w_A$ and $w_B$:

$$w_A = -\frac{(S_1 + S_2)}{2} + \sqrt{\frac{(S_1 + S_2)^2}{4} - \frac{S_1 S_2}{1 + A_o B_o}} \quad (40)$$

$$w_B = -\frac{(S_1 + S_2)}{2} - \sqrt{\frac{(S_1 + S_2)^2}{4} - \frac{S_1 S_2}{1 + A_o B_o}} \quad (41)$$

assume that $$S_1 = w_o(a + jb) \quad (42)$$

$$S_2 = w_o(a - jb) \quad (43)$$

then by substituting (42) and (43) into (40) and (41):

$$w_A = -aw_o\left[1 + \sqrt{1 - \frac{1 + \frac{b^2}{a^2}}{1 + A_o B_o}}\right] \quad (44)$$

$$w_B = -aw_o\left[1 - \sqrt{1 - \frac{1 + \frac{b^2}{a^2}}{1 + A_o B_o}}\right] \quad (45)$$

If $$A_o B_o >> 1 + \frac{a^2}{b^2}$$

then equations (44) and (45) reduce to $$w_A \approx -2aw_o \quad (46)$$

$$w_B \approx -aw_o \frac{\left(1 + \frac{b^2}{a^2}\right)}{2 A_o B_o} \quad (47)$$

and from (30) through (33) plus (46) and (47)

$$\frac{1}{R_f} \approx \frac{w_o^2}{g_{21}}(a^2 + b^2)(C_d + C_{11})(C_L + C_{22}) + g_{12} \quad (48)$$

-continued $$\frac{1}{R_L} \approx \quad (49)$$

$$-w_o[C_L + C_{22}]\left[2a + \frac{w_o}{g_{21}}(C_d + C_{11})(a^2 + b^2)\right] - g_{12} - g_{22}$$

CIRCUIT DESIGN PROCEDURE

Once the bandpass characteristics are known by the above-mentioned formulas, the procedures for the circuit design proceeds as follows:

Step 1: Calculate $I_{c1}$, using equation (5), Calculate $R_3 = 0.75(I_{c1})^{-1}$ Step 2: Assume $I_{c2} = 10 \; I_{c1}$, Calculate $R_2 = (V_s - 1.5)(I_{c2})^{-1}$ Step 3: Calculate $g_{11}$, $g_{12}$, $g_{21}$ and $g_{22}$ at $f=0$, using equations (8) through (23).

Step 4: Calculate $R_f$ and $R_5$, using equations (48) and (49).

Step 5: Calculate and plot, $Z_T$ versus frequency, using equations (7) through (26).

Step 6: Adjust $R_2$, $R_4$, $R_5$ and/or $R_f$ and repeat Step 5, until the desired result is obtained.

The resulting circuit having the values calculated in the procedure outlined above presents a transimpedance pre-amplifier which retains the characteristics of low distortion and a flat frequency response obtained by the use of the feedback resistor $R_f$ and also permits the use of an $R_f$ value which keeps the thermal noise at a low level so as not to interfere with the signal output. This design also accomplishes the tailoring of the frequency response to perform active filtering with a 3-pole response characteristic thereby eliminating the need for external discrete filters to establish receiver noise bandwidth. Additionally, the low frequency response may easily be moved to the 10 Hz range by practical value component selection and the difficulties of matching pole-zero locations for wide band equalization are eliminated.

What is claimed is:

1. A transimpedance amplifier comprising:
    an operational amplifier circuit having an input capacitance and an output impedance;
    a feedback resistor connected between the output and the input of said operational amplifier circuit, the product of the value of said feedback resistor and said input capacitance affecting the phase margin of said transimpedance amplifier; and
    means, coupled to the output of said operational amplifier circuit, for compensating for the effect of the product of the value of said feedback resistor and said input capacitance on said phase margin while simultaneously controlling the bandpass characteristic of said transimpedance amplifier.

2. A transimpedance amplifier according to claim 1, wherein said operational amplifier circuit includes a plurality of transistors having a high hFE and small common emitter input capacitance.

3. A transimpedance amplifier according to claim 2, wherein said transistors are small signal microwave transistors.

4. A transimpedance amplifier according to claim 1, wherein said operational amplifier circuit includes a three-terminal active element driving a load admittance.

5. A transimpedance amplifier according to claim 1, wherein said means comprises a resistance-capacitance network coupled between the output of said operational amplifier circuit and a reference potential terminal, the values of the components of said resistance-capacitance network being such as to compensate for said phase margin effect while establishing the bandpass characteristic of said transimpedance amplifier.

6. A transimpedance amplifier according to claim 5, wherein said resistance-capacitance network comprises a resistor and a capacitor connected in series.

* * * * *